United States Patent
Hill et al.

(10) Patent No.: US 6,944,807 B2
(45) Date of Patent: Sep. 13, 2005

(54) METHOD AND APPARATUS FOR ACHIEVING HIGHER PRODUCT YIELDS BY USING FRACTIONAL PORTIONS OF IMBEDDED MEMORY ARRAYS

(75) Inventors: J. Michael Hill, Ft Collins, CO (US); Jonathan E. Lachman, Fort Collins, CO (US); Warren K Howlett, Windsor, CO (US)

(73) Assignee: Hewlett-Packard Development Company, LP., Houston, TX (US)

( * ) Notice: Subject to any disclaimer, the term of this patent is extended or adjusted under 35 U.S.C. 154(b) by 517 days.

(21) Appl. No.: 10/107,291

(22) Filed: Mar. 25, 2002

(65) Prior Publication Data

US 2003/0182608 A1 Sep. 25, 2003

(51) Int. Cl.⁷ .............................. G11C 29/00
(52) U.S. Cl. .................. 714/723; 714/5; 714/710; 711/113; 711/114
(58) Field of Search .................. 714/5, 723, 710, 714/726, 738–739; 711/113, 114

(56) References Cited

U.S. PATENT DOCUMENTS 6,141,779 A * 10/2000 Hill et al. .................. 714/710

* cited by examiner

Primary Examiner—Guy Lamarre
(74) Attorney, Agent, or Firm—John Pessetto

(57) ABSTRACT

The invention provides a circuit and method for obtaining a fully functional microprocessor using only a fraction of the available on-chip cache. The memory sub-arrays of the on-chip cache are tested to determine which sub-arrays are functional. After determining which sub-arrays are functional, a set of sub-arrays is selected that constitute a binary fraction of the cache. The CPU is initialized to accommodate a smaller address space corresponding to the size of the selected sub-arrays. Finally, a group of signals are programmed to allow the CPU access to the selected sub-arrays.

5 Claims, 7 Drawing Sheets

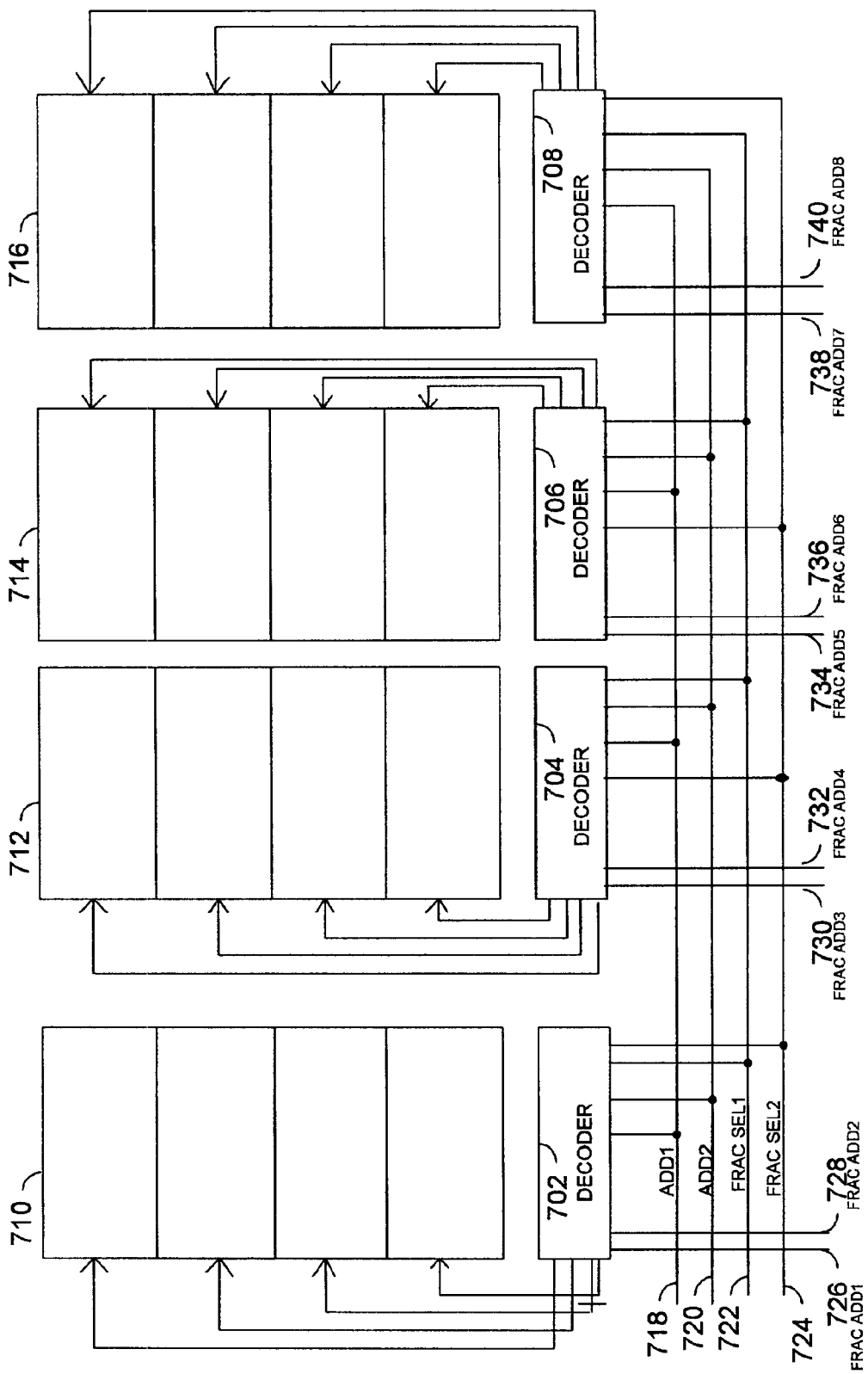

METHOD AND APPARATUS FOR ACHIEVING HIGHER PRODUCT YIELDS BY USING FRACTIONAL PORTIONS OF IMBEDDED MEMORY ARRAYS

FIELD OF THE INVENTION

This invention relates generally to electronic circuits. More particularly, this invention relates to improving the product yield of microprocessors and improving the time required to debug a new microprocessor design.

BACKGROUND OF THE INVENTION

The manufacturing process in which integrated circuits are designed is constantly changing. One method used to put more circuits on a single semiconductor chip is to reduce the size of individual transistors. The size and space between individual transistors and other features essential for operation of a microprocessor may be reduced by making smaller images on a photo-mask. As the images on photo-masks get smaller, the size of the defects that may adversely affect the circuitry also decrease. As the critical size of defects decreases, the number of functional chips recovered from a wafer may decrease. A reduction in the number of functional chips on a wafer usually increases the manufacturing cost of a single functional chip. Several design techniques have been used to increase the yield of good chips.

Redundant circuits are included in a design to replace non-functioning circuits. When a bad circuit is found, it may be replaced with a redundant circuit. For example, in ASIC (Application Specific Integrated Circuit) design, "FET Farms" are included in addition to the circuits required to design the ASIC. A FET farm is a group of logic blocks (NAND gates, NOR gates, etc.) that may be unused if no defects are found in the original design. However, if defective gates are found, replacements from the FET farm may be "patched" in to the overall circuit. In this way, a completely functional chip may be created thereby increasing the overall yield.

Another example of where redundancy may be used to improve the yield of semiconductor chips is sub-array redundancy. Instead of replacing an individual logic gate or a group of logic gates, a redundant sub-array may replace a defective sub-array with a larger array. SRAMs (Static Random Access Memory), DRAMs (Dynamic Random Access Memory) and CAMs (Content Addressable Memory) are examples of arrays that may utilize redundancy. Redundant sub-arrays may be included in the design of these memories. If part of the original array is non-functional, a redundant sub-array may be substituted for the defective sub-array.

While redundant circuit design may help to improve the yield of fully functional microprocessor designs, it does not enable the use of partial arrays. The yield of complex microprocessors may be low when a new process is used to manufacture them. As a result, there may be few fully functional microprocessor chips available to "debug" the electrical design. If a fraction of cache (½, ¼, etc.) on a microprocessor could be made functional and the CPU enabled to work with a fraction of the cache, it would decrease the time required to debug the electrical design of the microprocessor. In addition, microprocessors with fractional caches could be sold for applications that don't require as much cache as a microprocessor with a fully function cache.

The following description of an apparatus and method for achieving fractional caches on a microprocessor addresses a need in the art to reduce debug times of microprocessors and make available more functional microprocessors at an earlier time.

SUMMARY OF THE INVENTION

An embodiment of the invention provides a circuit and method for obtaining a functional fractional on-chip cache on a microprocessor. The memory arrays of the on-chip cache are tested to determine which sub-arrays are functional. After determining which sub-arrays are functional, a set of sub-arrays is selected that constitute a binary fraction of the cache. The CPU is initialized to accommodate a smaller address space corresponding to the set of selected sub-arrays. Finally, a group of signals are programmed to allow the CPU access to the selected sub-arrays.

Other aspects and advantages of the present invention will become apparent from the following detailed description, taken in conjunction with the accompanying drawing, illustrating by way of example the principles of the invention.

BRIEF DESCRIPTION OF THE DRAWINGS

FIG. 7 is a block diagram representing four arrays, each array divided into four sub-arrays, with a decoder for each array.

DETAILED DESCRIPTION OF THE PREFERRED EMBODIMENT

Figure 1:
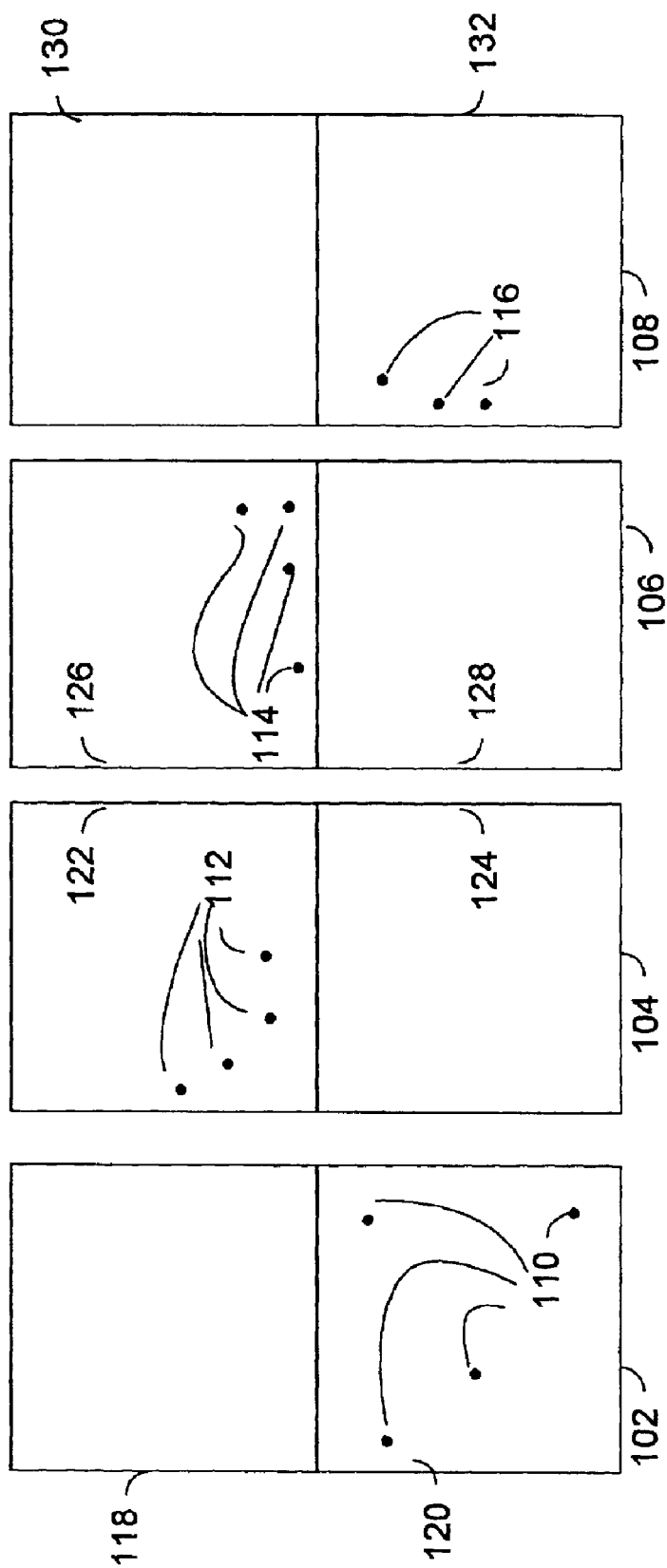
FIG. 1 is a block diagram representing four arrays, each array divided into two sub-arrays, where each array has at least one sub-array free of defects.

FIG. 1 shows a block diagram with four arrays, 102, 104, 106, and 108. Each array is divided into two sub-arrays. In array 102, the lower sub-array, 120 is shown to have defects, 110. Because the lower sub-array, 120, of array, 102 has defects, 110, only the upper sub-array, 118 is fully functional. In array 104, the upper sub-array, 122, is shown to have defects, 112. Because the upper sub-array, 122, of array 104 has defects, 112, only the lower sub-array, 124, is fully functional. In array 106, the upper sub-array, 126 is shown to have defects, 114. Because the upper sub-array, 126, of array, 106 has defects, 114, only the lower sub-array, 128 is fully functional. In array 108, the lower sub-array, 132, is shown to have defects, 116. Because the lower sub-array, 132, of array 108 has defects, 116, only the upper sub-array, 130, is fully functional. A fully functional cache with half the number of original bits may be created using sub-arrays 118, 124, 128, and 130 together.

Figure 2:
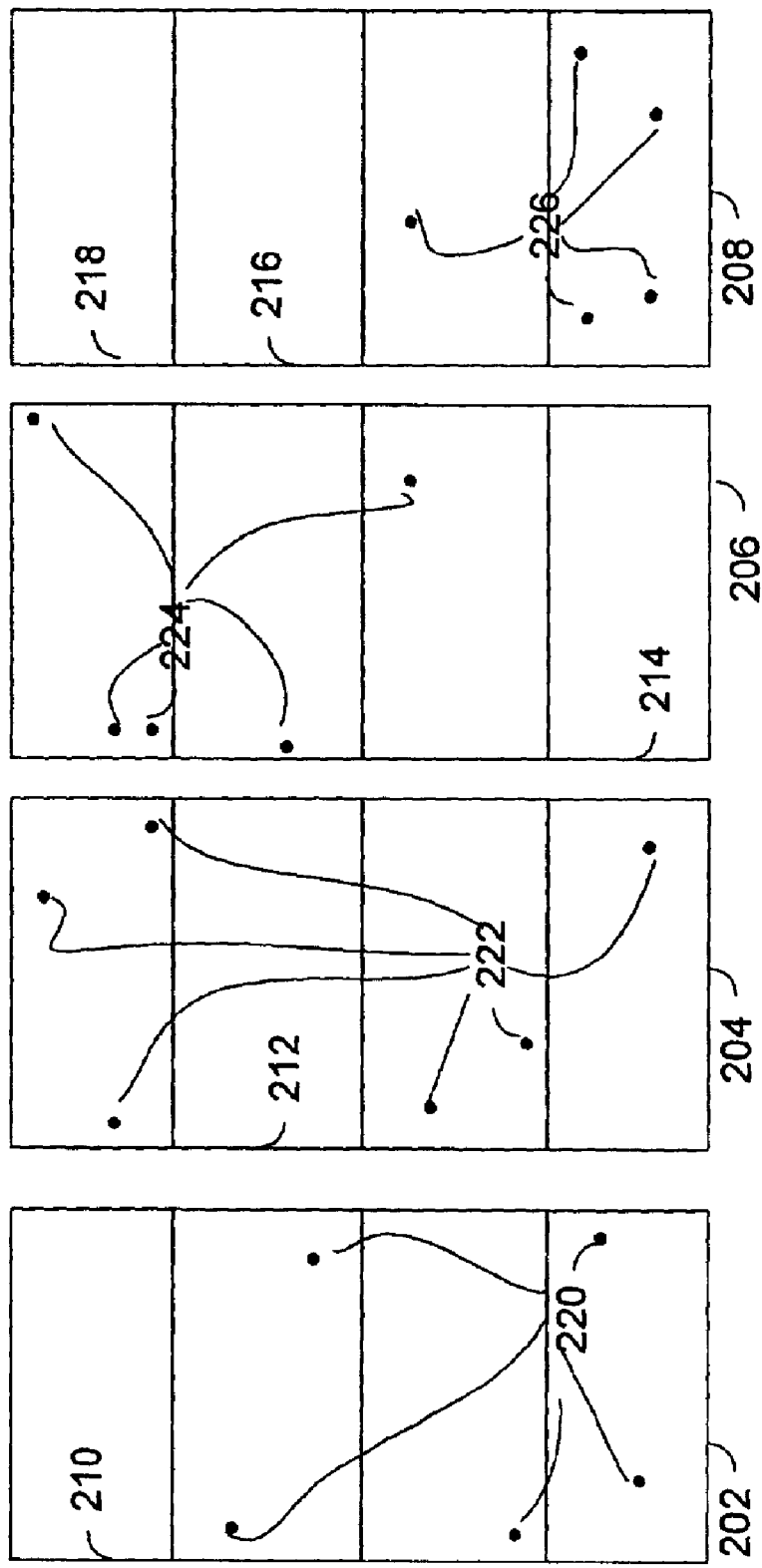
FIG. 2 is a block diagram representing four arrays, each array divided into four sub-arrays, where each array has at least one sub-array free of defects.

FIG. 2 shows a block diagram with four arrays, 202, 204, 206, and 208. Each array is divided into four sub-arrays. In array 202, the sub-array, 210, is shown to have no defects. The other sub-arrays in array 202 have defects, 220. Only sub-array, 210 in array, 202, is fully functional, In array 204, the sub-array, 212, is shown to have no defects. The other sub-arrays in array 204 have defects, 222. Only sub-array, 212, in array 204, is fully functional. In array 206, the sub-array, 214 is shown to have no defects. The other sub-arrays in array 206 have defects, 224. Only sub-array, 214, in array 206 is fully functional. In array 208, sub-arrays, 216 and 218, are shown to have no defects, 226. The other sub-arrays in array 208 have defects, 226. Only sub-arrays, 218 and 216, in array 208 are fully functional. A fully functional cache with a quarter of the number of original bits may be created using sub-arrays 210, 212, 214, and 216, or sub-arrays 210, 212, 214, and 218.

Figure 3:
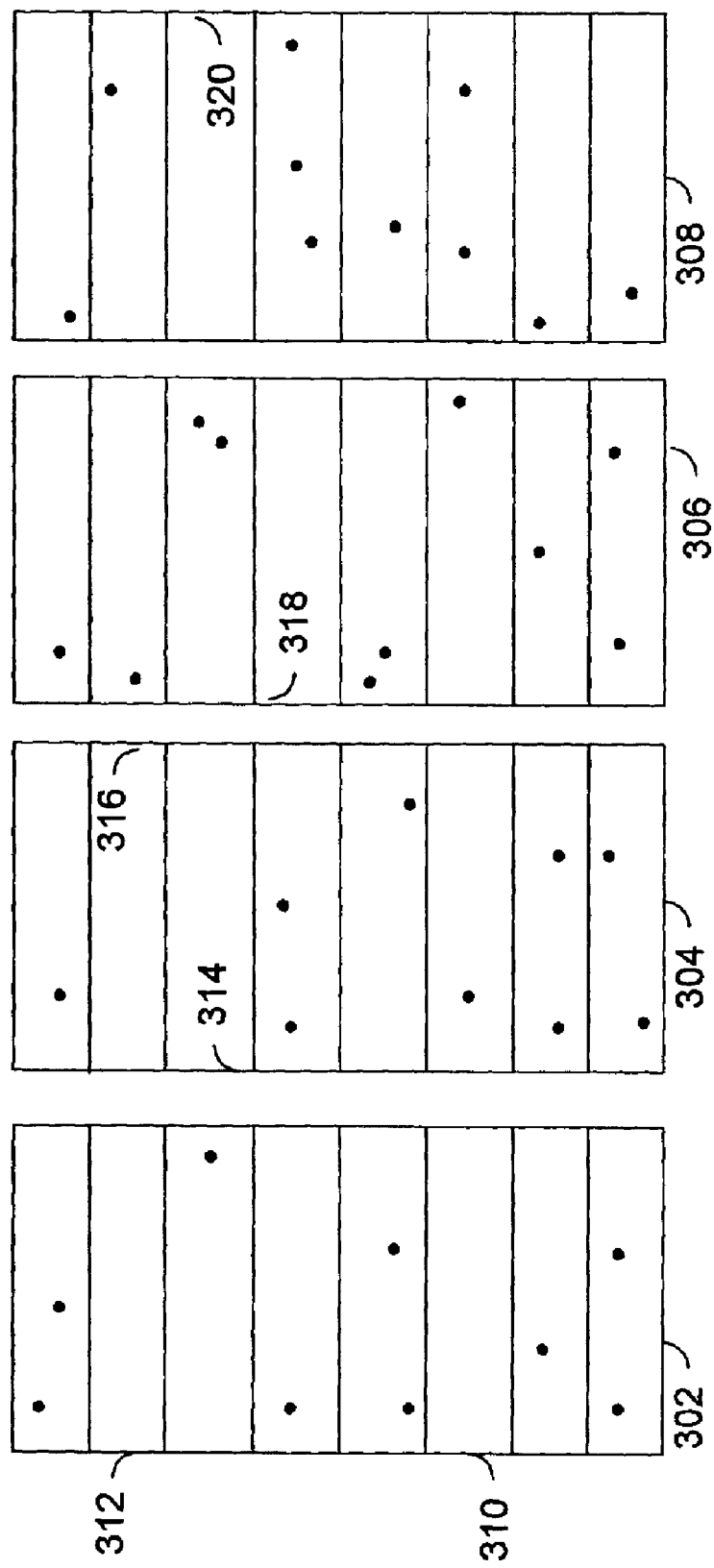
FIG. 3 is a block diagram representing four arrays, each array divided into eight sub-arrays, where each array has at least one sub-array free of defects.

FIG. 3 shows a block diagram with four arrays, 302, 304, 306, and 308. Each array is divided into eight sub-arrays. In array 302, sub-arrays 310 and 312 are shown to have no defects. The other sub-arrays in array 302 have defects. Only sub-arrays, 310 and 312 in array, 302, are fully functional. In array 304, the sub-arrays, 314 and 316, are shown to have no defects. The other sub-arrays in array 304 have defects. Only sub-arrays, 314 and 316, in array 304 are fully functional. In array 306, the sub-array, 318 is shown to have no defects. The other sub-arrays in array 306 have defects. Only sub-array, 318, in array 306 is fully functional. In array 308, sub-array, 320, is shown to have no defects. The other sub-arrays in array 308 have defects. Only sub-array, 320, in array 308, is fully functional. Several fully functional caches with an eighth of the number of original bits may be created. One example of a fully functional cache with an eighth of the number of original bits may be created using sub-arrays 312, 314, 318, and 320.

Figure 4:
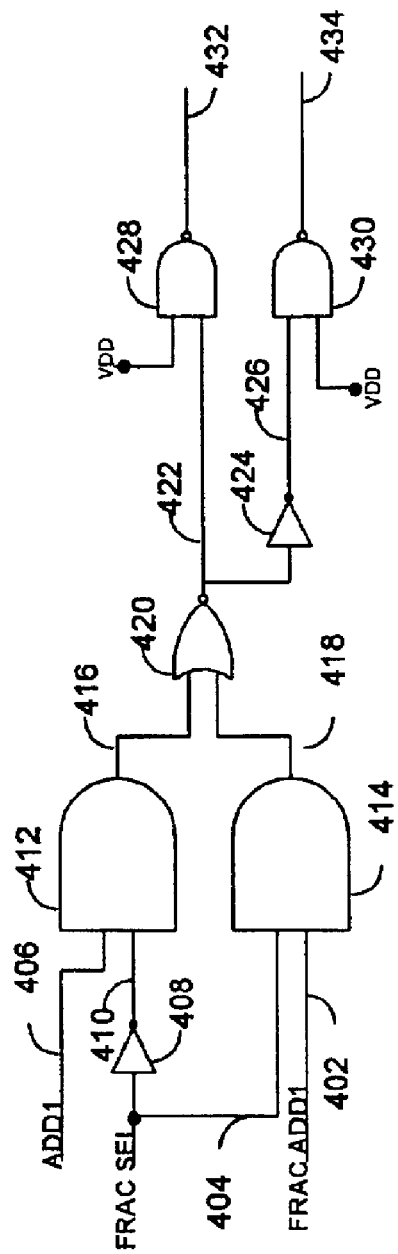
FIG. 4 is a schematic drawing of a single address decoder used to select one of two sub-arrays.

In all the previous examples of fractional caches, sub-arrays without defects were selected to create a fully functional fractional cache. In order to select a sub-array without defects from an array, a decoder may be used. FIG. 4 is a schematic drawing of an example of decoder used to select one of two sub-arrays in an array.

A row address, ADD1, 406 is electrically connected to an input, 406, of a two-input AND logic gate, 412. A signal, FRAC SEL, 404, selects either the normal mode of operation or the fraction mode. FRAC SEL, 404 is electrically connected to the input of an inverter, 408, and to the input, 404 of a second two-input AND logic gate, 414. The output, 410, of inverter, 408 is electrically connected to the second input, 410 of the first two-input AND logic gate, 412. Fractional Address, FRAC ADD1, 402, is electrically connected to the second input, 402 of two-input AND logic gate, 414. FRAC ADD1, 402, and FRAC SEL, 404, may be programmed using EPROMs, (Erasable Programmable Read Only Memory), EEPROMs (Electrically Erasable Programmable Read Only Memory), laser-blown fuses, electrically-blown fuses, remote diagnostic registers, or any other suitable technique for presenting a voltage on nodes 402 and 404.

The outputs of AND gates 412 and 414 are electrically connected to the inputs, 416 and 418 of a two-input NOR logic gate, 420. The output, 422, of the NOR logic gate, 420 is electrically connected to the input, 422, of the inverter 424 and to an input, 422 of a two-input NAND logic gate 428. The output, 426 of the inverter, 424, is electrically connected to an input, 426, of the two-input NAND logic gate, 430. The positive power supply, VDD, is connected to an input of NAND logic gates, 428, and 430. The outputs, 432, and 434, may be used to activate row decoders in the upper or lower half of an array.

Figure 5:
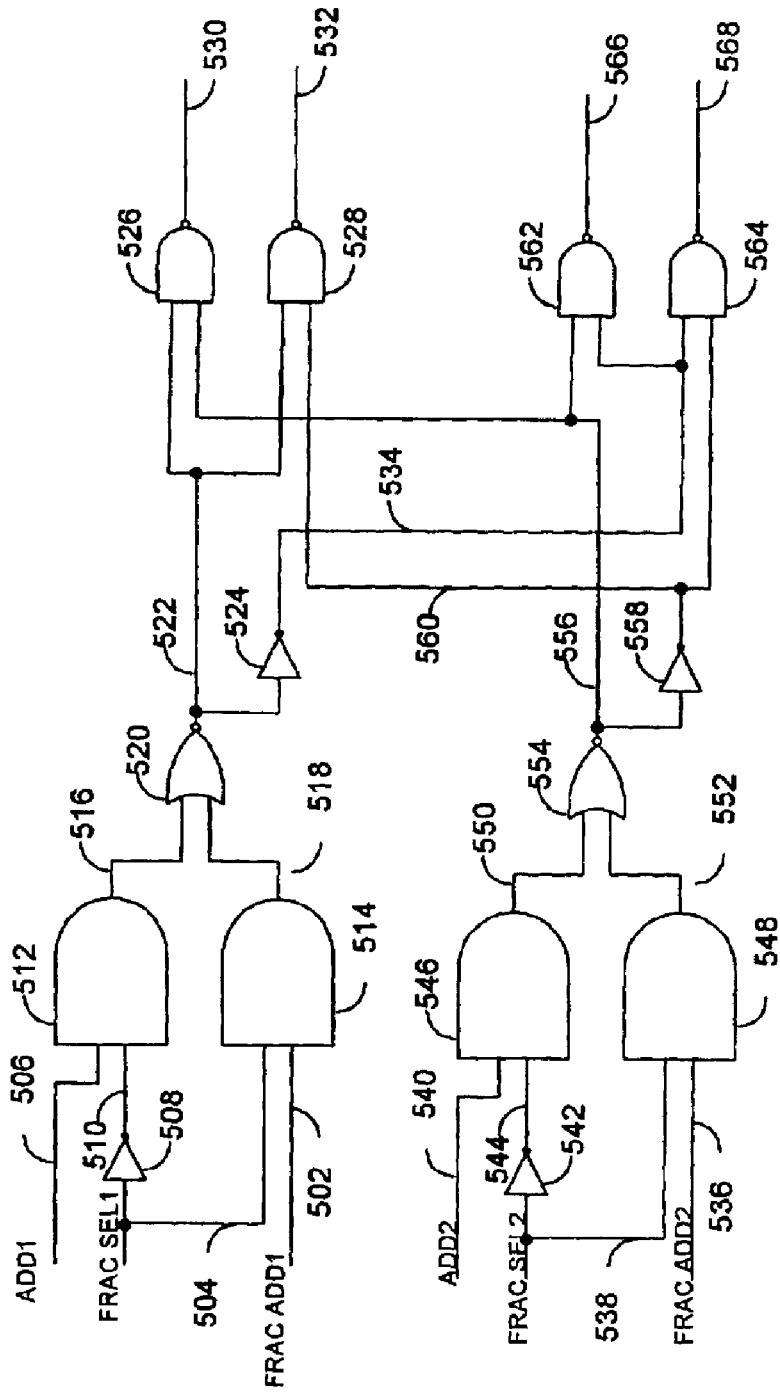
FIG. 5 is a schematic drawing of two address decoders used to select one of four sub-arrays.

FIG. 5 is a schematic drawing of an example of decoder used to select one of two half-size sub-arrays or one of four quarter-size sub-arrays in an array.

A row address, ADD1, 506 is electrically connected to an input, 506, of a two-input AND logic gate, 512. A signal, FRAC SEL1, 504, selects either the normal mode of operation or the fraction mode. FRAC SEL1, 504 is electrically connected to the input of an inverter, 508, and to the input, 504 of a second two-input AND logic gate, 514. The output, 510, of inverter, 508 is electrically connected to the second input, 510 of the first two-input AND logic gate, 512. Fractional address, FRAC ADD1, 502, is electrically connected to the second input, 502 of two-input AND logic gate, 514. FRAC ADD1, 502, and FRAC SEL1, 504, may be programmed using EPROMs, (Erasable Programmable Read Only Memory), EEPROMs (Electrically Erasable Programmable Read Only Memory), laser-blown fuses, electrically-blown fuses, remote diagnostic registers, or any other suitable technique for presenting a voltage on nodes 502 and 504.

The outputs of AND gates 512 and 514 are electrically connected to the inputs, 516 and 518 of a two-input NOR logic gate, 520. The output, 522, of the NOR logic gate, 520 is electrically connected to the input, 522, of the inverter 524, to an input, 522 of a two-input NAND logic gate 526, and to an input, 522 of a two-input NAND, 528. The output, 534 of the inverter, 524, is electrically connected to an input, 534, of the two-input NAND logic gate, 562 and to an input, 534, of the two-input NAND logic gate, 564.

A row address, ADD2, 540 is electrically connected to an input, 540, of a two-input AND logic gate, 546. A signal, FRAC SEL2, 538, selects either the normal mode of operation or the fraction mode. FRAC SEL2, 538 is electrically connected to the input of an inverter, 542, and to the input, 538 of a second two-input AND logic gate, 548. The output, 544, of inverter, 542 is electrically connected to the second input, 544 of the first two-input AND logic gate, 546. Fractional address, FRAC ADD2, 536, is electrically connected to the second input, 536 of two-input AND logic gate, 548. FRAC ADD2, 536, and FRAC SEL2, 538, may be programmed using EPROMs, (Erasable Programmable Read Only Memory), EEPROMs (Electrically Erasable Programmable Read Only Memory), laser-blown fuses, electrically-blown fuses, remote diagnostic registers, or any other suitable technique for presenting a voltage on nodes 536 and 538.

The outputs of AND gates 546 and 548 are electrically connected to the inputs, 550 and 552 of a two-input NOR logic gate, 554. The output, 556, of the NOR logic gate, 554 is electrically connected to the input, 556, of the inverter 558, to an input, 556 of a two-input NAND logic gate 526, and to an input, 556 of a two-input NAND, 562. The output, 560 of the inverter, 558, is electrically connected to an input, 560, of the two-input NAND logic gate, 528 and to an input, 560, of the two-input NAND logic gate, 564. The outputs, 530, 532, 566, and 568 may be used to activate row decoders in any one sub-array of four sub-arrays in an array.

Using the techniques previously shown, a decoder may be designed that allows the selection of a single sub-array from any number of sub-arrays expressed as a power of two (e.g. 2, 4, 8, 16, 32, 64, etc.).

Figure 6:
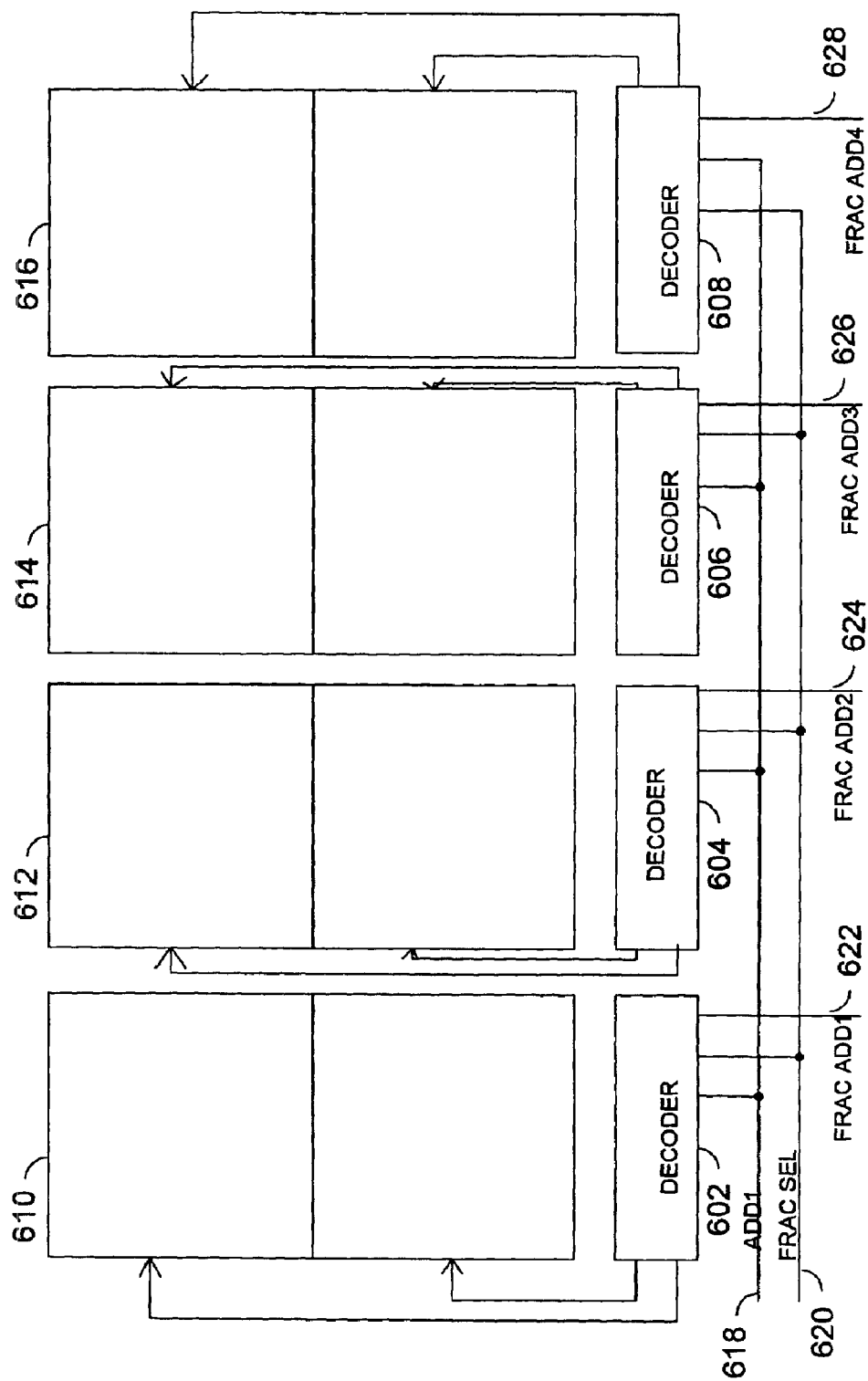
FIG. 6 is a block diagram representing four arrays, each array divided into two sub-arrays, with a decoder for each array.

FIG. 6 illustrates how one-of-two decoders, 602, 604, 606, and 608 may be used to selected the upper or lower sub-arrays of arrays 610, 612, 614, and 616 respectively. If the FRAC SEL signal, 620, selects the "normal" operation address, Add1, 618, the arrays 610, 612, 614, and 616 are fully accessible by the CPU. If however, the FRAC SEL signal, 620, selects the "fractional" mode of operation, only one sub-array of each array is accessible. FRAC ADD1, 622, FRAC ADD2, 624, FRAC ADD3, 626 and FRAC ADD4, 628 determine which sub-array from arrays 610, 612, 614, and 616 respectively are selected. In this way the upper or lower half of an individual sub-array may be selected independent of the other arrays.

FIG. 7 illustrates how the decoders 702, 704, 706, and 708, shown in FIG. 5, may be used to selected two sub-arrays from four sub-arrays or one sub-array from four sub-arrays from each array 710, 712, 714, and 716 respectively. If the signals, FRAC SEL1, 722 and FRAC SEL2, 724, select the "normal" operation addresses, Add1, 718, and Add2, 720, the arrays 710, 712, 714, and 716 are fully accessible by the CPU.

If FRAC SEL1, 722, selects the "fractional mode" of operation and FRAC SEL2, 724, selects the "normal mode" of operation, only two of four sub-arrays of each array is selected. FRAC ADD1, 726, FRAC ADD3, 730, FRAC ADD5, 734 and FRAC ADD7, 738 determine which sub-arrays in arrays 710,712,714, and 716 respectively are selected.

If FRAC SEL1, 724 selects the "fractional mode" of operation and FRAC SEL2, 722 selects the "normal mode" of operation, only two of four sub-arrays of each array is selected. FRAC ADD2 728, FRAC ADD4 732, FRAC ADD6 736 and FRAC ADD8, 740 determine which sub-arrays in arrays 710,712,714, and 716 respectively are selected.

If however, FRAC SEL1, 722, and FRAC SEL2, 724, select the "fractional" mode of operation, only one sub-array of each array is selected. FRAC ADD1, 726, FRAC ADD2, 728, FRAC ADD3, 730, FRAC ADD4, 732, FRAC ADD5, 734, FRAC ADD6, 736, FRAC ADD7, 738, and FRAC ADD8, 740 determine which sub-arrays in arrays 710, 712, 714, and 716 respectively are selected. In this way an individual sub-array from each array may be selected independent of the other arrays.

Any binary fraction (e.g. ½, ¼, ⅛, 1/16, etc.) of a cache may be selected with the appropriate decoder. This method of selecting a partial cache may be used alone or in conjunction with redundancy schemes.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit for obtaining a functional fractional on-chip cache comprising:

a set of functional sub-arrays selected from a cache;

a CPU initialized to address said set of functional sub-arrays;

a set of decoders configured to select only rows from said set of functional sub-arrays;

wherein a decoder from said set of decoders logically comprises:

at least one address-select block, with three inputs and a complementary output, that selects an address bit or a first programmed fractional bit based on the binary value of a second programmed fractional bit, the first input connected to said address bit, the second input connected to said first programmed fractional bit, the third input connect to said second programmed fractional bit and said complementary output connected to a first and a second node;

a least one logical NAND block, with at least two inputs and one output;

wherein the output nodes of said address-select blocks are electrically connected to the inputs of said NAND blocks such that only one output of said NAND blocks is active.

2. The circuit of claim 1 wherein said decoder consists of only one said address-select block and two said logical NAND blocks.

3. The circuit of claim 1 wherein said decoder consists Of only two said address-select blocks and four said logical NAND blocks.

4. The circuit of claim 1 wherein said decoder consists of only three said address-select blocks and eight said logical NAND blocks.

5. The circuit of claim 1 wherein said decoder consists of wily four said address-select blocks and sixteen amid logical NAND blocks.

* * * * *

UNITED STATES PATENT AND TRADEMARK OFFICE
CERTIFICATE OF CORRECTION

PATENT NO. : 6,944,807 B2  
APPLICATION NO. : 10/107291  
DATED : September 13, 2005  
INVENTOR(S) : J. Michael Hill et al.

Page 1 of 1

It is certified that error appears in the above-identified patent and that said Letters Patent is hereby corrected as shown below:

In column 6, line 28, in Claim 1, delete "a least" and insert -- at least --, therefor.

In column 6, line 37, in Claim 3, delete "Of" and insert -- of --, therefor.

In column 6, line 44, in Claim 5, delete "wily" and insert -- only --, therefor.

In column 6, line 44, in Claim 5, delete "amid" and insert -- said --, therefor.

Signed and Sealed this

Eleventh Day of August, 2009

David J. Kappos  
*Director of the United States Patent and Trademark Office*